United States Patent
Qiu et al.

(10) Patent No.: US 7,786,471 B2
(45) Date of Patent: Aug. 31, 2010

(54) ORGANIC ELECTROLUMINESCENCE DEVICE

(75) Inventors: Yong Qiu, Beijing (CN); Yudi Gao, Beijing (CN); Deqiang Zhang, Beijing (CN); Liduo Wang, Beijing (CN)

(73) Assignees: Tsinghua University, Beijing (CN); Beijing Visionox Technology Co., Ltd., Beijing (CN)

( * ) Notice: Subject to any disclaimer, the term of this patent is extended or adjusted under 35 U.S.C. 154(b) by 25 days.

(21) Appl. No.: 11/289,622

(22) Filed: Nov. 30, 2005

(65) Prior Publication Data

US 2006/0232192 A1 Oct. 19, 2006

(30) Foreign Application Priority Data

Apr. 13, 2005 (CN) ............... 2005 1 0064538
Nov. 4, 2005 (CN) ............... 2005 1 0117296

(51) Int. Cl.
*H01L 35/24* (2006.01)
*H01L 51/00* (2006.01)

(52) U.S. Cl. ............... 257/40; 257/79; 257/E33.001

(58) Field of Classification Search ............... 257/40, 257/79; 438/99
See application file for complete search history.

(56) References Cited

U.S. PATENT DOCUMENTS

2002/0155319 A1* 10/2002 Kawamura et al. ............ 428/690
2003/0062845 A1* 4/2003 Yamazaki et al. ............ 315/169.3
2004/0132228 A1* 7/2004 Magno et al. ................. 438/99

* cited by examiner

*Primary Examiner*—Eugene Lee
*Assistant Examiner*—Anthony Ho
(74) *Attorney, Agent, or Firm*—Foley and Lardner LLP (57) ABSTRACT

The present invention relates to an organic electroluminescence device comprising a substrate, an anode, a hole injection layer, a hole transport layer, a light-emitting layer, an electron transport layer, an electron injection layer, and a cathode, wherein the electron injection layer contains alkali metal nitride and has a thickness of 0.2-10 nm. The organic electroluminescence device of the present invention has improved electron injection from the cathode to the organic layer, high device luminance and efficiency, long device lifetime, low material poisonousness, wide choice of film-forming thickness and low film-forming temperature.

8 Claims, 3 Drawing Sheets

ORGANIC ELECTROLUMINESCENCE DEVICE

RELATED APPLICATIONS

This application claims priority under 35 USC §119 to Chinese patent applications 2005/10064538.X filed Apr. 13, 2005 and 2005/10117296.6 filed Nov. 4, 2005.

TECHNICAL FIELD OF THE INVENTION

The present invention relates to an organic electroluminescence device, and more particularly, to an organic electroluminescence device with an improved electron injection layer.

BACKGROUND OF THE INVENTION

An organic electroluminescence flat display has many significant advantages, such as initiative light-emitting, light, thin, good contrast, independence of an angle, low power consumption and the like. In 1963, an organic electroluminescence device was fabricated by Pope et al with an anthracene single crystal. However, the first high efficient organic light-emitting diode (OLED) fabricated by vacuum evaporation was an OLED developed by C. W. Tang et al in 1987, wherein aniline-TPD was used as a hole transport layer (HTL), and a complex of aluminium and 8-hydroxyquinoline-ALQ was used as a light-emitting layer (EML). Its operating voltage was less than 10V, and its luminance was up to 1000 cd/m². The light-emitting wavelength of organic electroluminescence materials developed later could cover the whole range of visible light. This breakthrough development made the field becoming a currently research hotspot. After entering 1990s, organic high molecular optical-electric functional materials entered a new development stage.

In an organic electroluminescence device, in order to reduce the operating voltage of the device and improve the charge balance between electrons and holes, it is necessary to increase electron injection efficiency.

The use of a low work function metal as a cathode can effectively improve electron injection ability. However, the low work function metal is too active and apt to react with water and oxygen.

Another method for improving electron injection ability is to add an electron injection layer formed of an inorganic compound layer between said cathode and an organic layer. It has been proved in practice that LiF/Al is a cathode structure having excellent electron injection ability, which is widely used in OLED products. However, the present of halogen elements may cause quench of light emission, materials exhibit relatively large poisonousness, and the film-forming temperature of the materials is high. Moreover, the thickness of the formed electron injection layer is critical; and when $Li_2O$, $LiAlO_2$ or $Li_2CO_3$ is used as a injection layer material, the lifetime is short and the efficiency is low.

SUMMARY OF THE INVENTION

One object of the present invention is to provide an electron injection layer material having excellent ability, low poisonousness, long lifetime, low film-forming temperature and wide choice of the thickness, and an organic electroluminescence device thereof.

In order to achieve above object, the inventor has done deep and systemic research on alkali metal compound used as an electron injection layer, specifically such as alkali metal oxide, alkali metal superoxide, alkali metal halide, alkali metal nitride and alkali metal salt. After doing a lot of experiments, the inventor selects alkali metal nitride from above alkali metal compound. Specifically, lithium nitride has excellent injection ability, low film-forming temperature, wide choice of the thickness and long device lifetime. Furthermore, the inventor has also researched the thickness of alkali metal nitride used as an electron injection layer within a range of 0.1-10 nm. As a result, when the thickness of a $Li_3N$ electron injection layer is 0.2-5.0 nm, especially, when the thickness is 0.2-0.9 nm, the current efficiency of the device is significantly higher than that of $Li_3N$ electron injection layers of other thicknesses. Further, when the light-emitting layer is doped with dyes, the device lifetime is up to 25,000 hours.

In order to achieve above object, the present invention is to provide an organic electroluminescence device comprising a substrate, an anode formed on the substrate, a light-emitting layer formed on the anode, an electron injection layer formed on the light-emitting layer, and a cathode formed on the electron injection layer, characterized in that said electron injection layer contains alkali metal nitride.

Said alkali metal nitride is one of $Li_3N$, $Na_3N$, $K_3N$, $Rb_3N$ and $Cs_3N$, and has a thickness of 0.2-10 nm.

Said alkali metal nitride has a thickness of 0.2-2.0 nm.

Said alkali metal nitride has a thickness of 0.2-0.9 nm.

Said electron injection layer further contains Al of 20-80% by weight.

Further, a hole injection layer is comprised between said anode and said light-emitting layer.

Further, a hole transport layer is comprised between said hole injection layer and said light-emitting layer.

Further, an electron transport layer is comprised between said light-emitting layer and said electron injection layer.

Said light-emitting layer (105) contains dyes.

A method for fabricating above organic electroluminescence device, comprising:

(1) placing a substrate comprising an anode into a vacuum chamber after cleaning and drying, and evaporating an organic light-emitting layer; or, placing a substrate comprising an anode into a vacuum chamber after cleaning and drying, evaporating a hole injection layer and/or a hole transport layer sequentially, and then evaporating an organic light-emitting layer;

(2) evaporating an electron injection layer on the organic light-emitting layer; or, evaporating an electron transport layer and an electron injection layer on the organic light-emitting layer sequentially;

wherein the evaporation rate of said electron injection layer is 0.08-2.50 Å/s, the thickness is 0.2-0.9 nm, and the evaporation temperature is 350° C.-500° C.; and (3) evaporating a cathode material on the electron injection layer.

The advantageous effects of the organic electroluminescence device according to the present invention include: high efficiency of injecting electrons from a cathode to an organic layer, high device luminance and efficiency, long device lifetime, low material poisonousness, wide choice of film-forming thickness and low film-forming temperature. In the case where the vacuum degree is $1\times10^{-3}$ Pa, the temperature at which the evaporation rate of a $Li_3N$ electron injection layer material is up to 0.02 nm/s is 400° C., however the temperature at which the evaporation rate of LiF reaches the same is 650° C. at the same vacuum degree. When the thickness of the $Li_3N$ electron injection layer is 0.2-0.9 nm, the current efficiency of the device is significantly higher than that of $Li_3N$ electron injection layers of other thicknesses. Further, when a light-emitting layer is doped with dyes, the device lifetime is up to 25,000 hours.

DETAILED DESCRIPTION OF THE PREFERRED EMBODIMENTS

Figure 2:
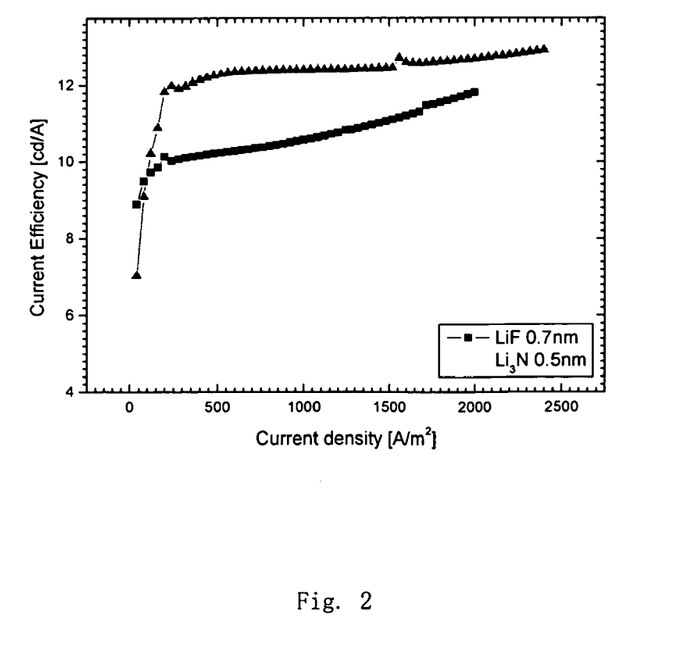
FIG. 2 is a graph illustrating current efficiency v. current density of devices of Embodiment 6 and Comparative Embodiment 4.

It can be seen from the current efficiency v. current density graph of devices shown in FIG. 2: the current efficiency of a device in which a $Li_3N$ material is used as an electron injection layer is significantly higher than that of a device in which LiF is used as an electron injection layer.

Figure 3:
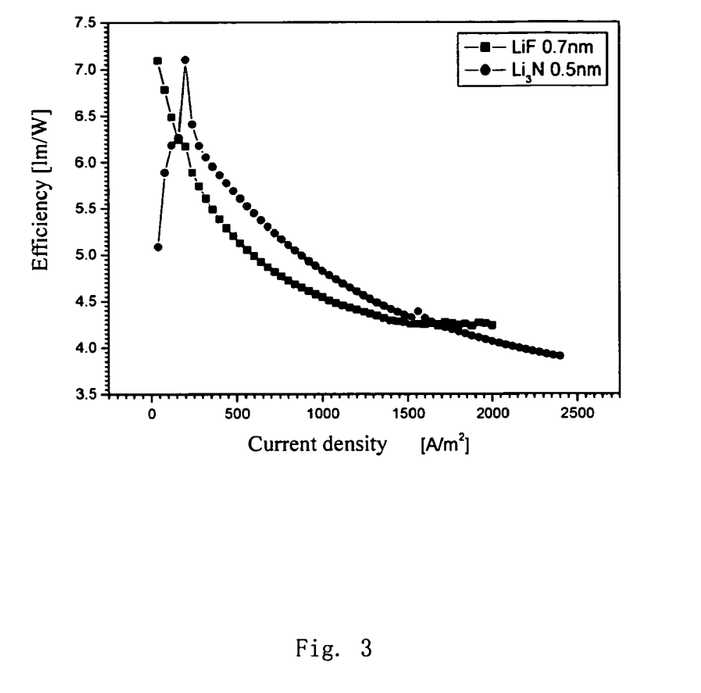
FIG. 3 is a graph illustrating power efficiency v. current density of devices of Embodiment 6 and Comparative Embodiment 4.

It can be seen from the power efficiency data of devices shown in FIG. 3: the power efficiency of a device in which a $Li_3N$ material is used as an electron injection layer is significantly higher than that of a device in which $Li_3N$ is used as an electron injection layer.

Figure 4:
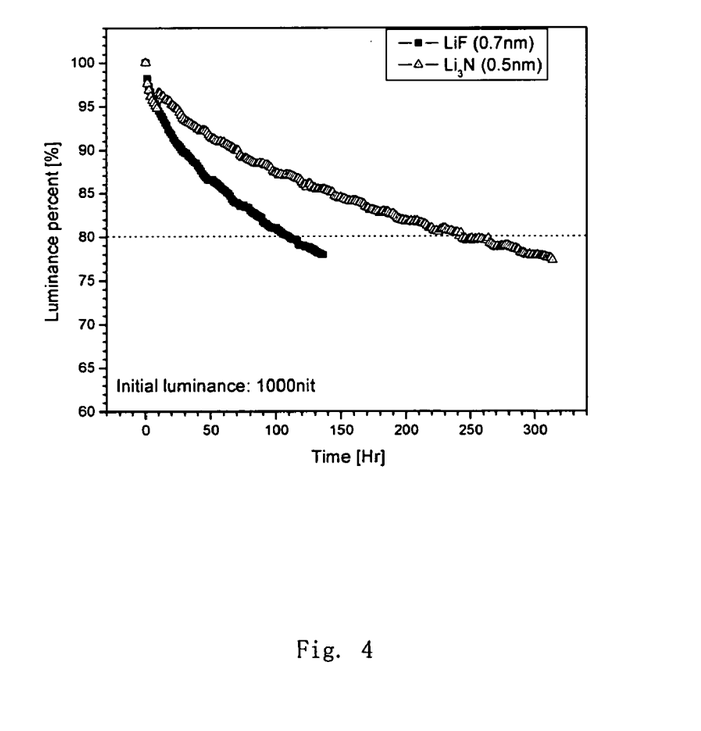
FIG. 4 is a graph illustrating device lifetime of Embodiment 6 and Comparative Embodiment 6.

It can be seen from the device lifetime graph shown in FIG. 4: the lifetime of a device in which a $Li_3N$ material is used as an electron injection layer is significantly higher than that of a device in which $Li_3N$ is used as an electron injection layer.

Figure 5:
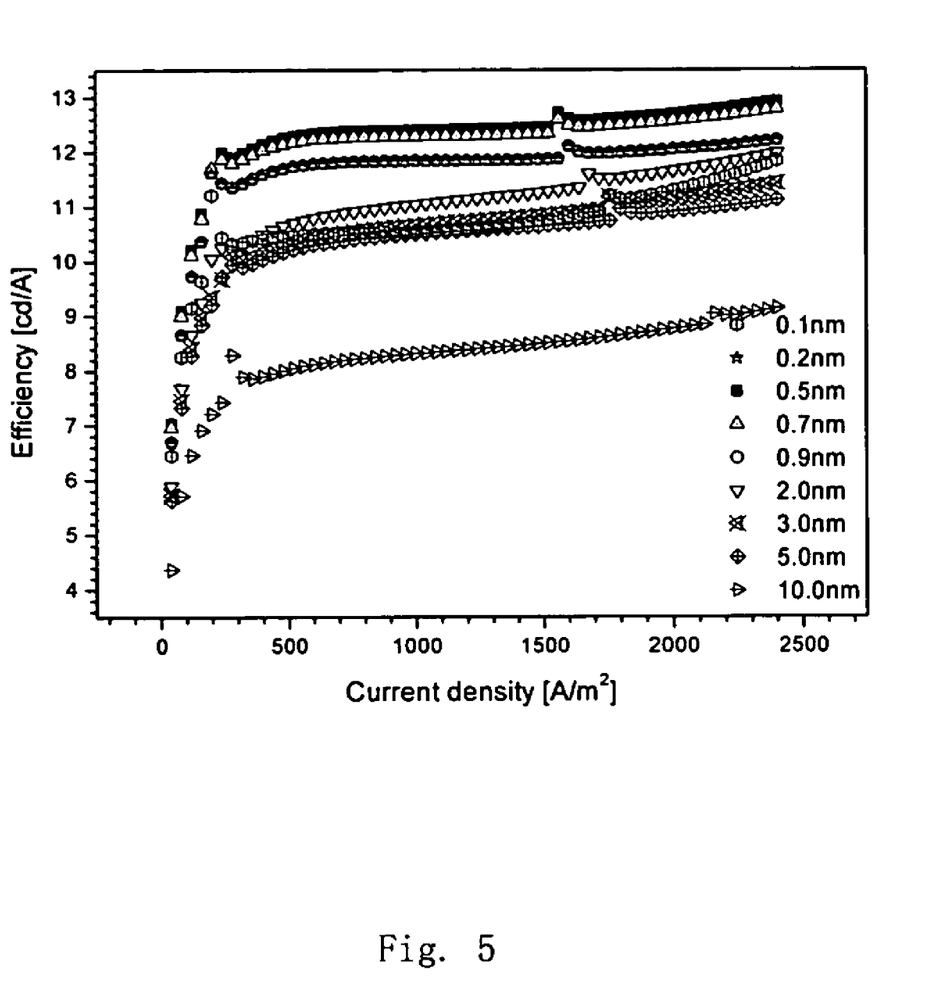
FIG. 5 is a graph illustrating current efficiency v. current density of devices of $Li_3N$ electron injection layers of different thicknesses.

It can be seen from the current efficiency v. current density graph of devices of $Li_3N$ electron injection layers of different thicknesses shown in FIG. 5: when the thickness of the $Li_3N$ electron injection layer is 0.2-2.0 nm, the current efficiency of the device is significantly higher than that of $Li_3N$ electron injection layers of thicknesses of above 2.0 nm and below 0.2 nm.

An electron injection layer of the present invention is a layer between a cathode and an organic layer.

Figure 1:
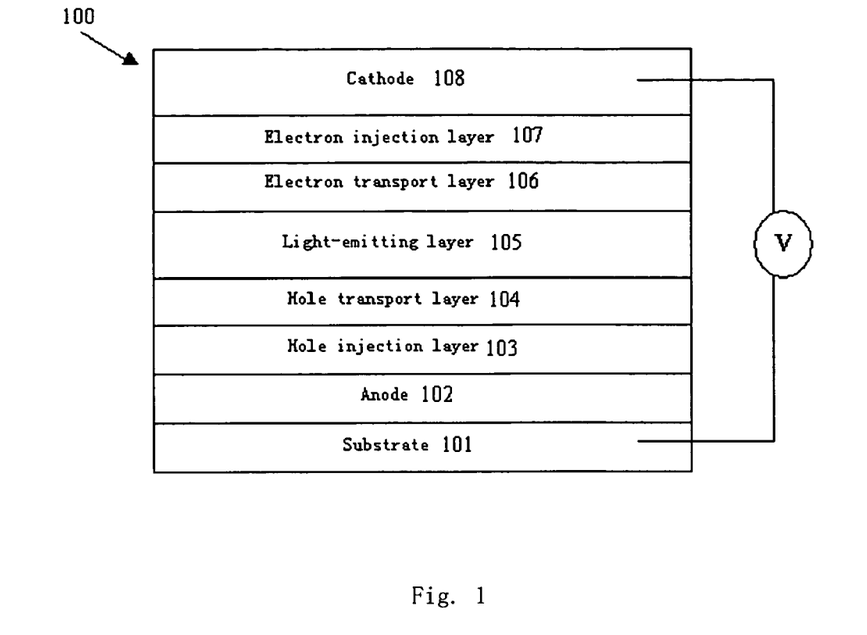
FIG. 1 shows a layer structure of OLED.

As shown in FIG. 1, the constituent and function of layers forming OLED device of FIG. 1 now will be described as follows:

A substrate 101 is used to support other layers of OLED device;

Holes flow from an anode 102 when voltage is applied to the device;

Hole injection layer 103 has a function to improve efficiency of injecting holes from an anode to an organic layer;

Hole transport layer 104 has a function to transport holes to a light-emitting layer 105;

The light-emitting layer 105 provides a place for recombination of electrons and holes, and emits light after recombination;

Electron transport layer 106 has a function to transport electrons to the organic layer;

Electrons flow from a cathode 108 when voltage is applied to the device;

The functions and materials of the layers of OLED device and the preparation process of the same are well known by those skilled in the art, which will not be described in detail herein.

The electron injection layer formed of above material can be evaporated on the light-emitting layer 105 or the electron transport layer 106. It has a thickness of 0.2-10 nm, preferably, 0.2-2.0 nm, and the most preferably, 0.2-0.9 nm. If the thickness is less than 0.1 nm, it is not easy to form the electron injection layer film. If the thickness is more than 2.0 nm, the effect of injecting electrons may be reduced. It should be understood that it is useable with other thicknesses.

It should be understood for those skilled in the art that it is preferred to use the implementation of the layer structure of OLED shown in FIG. 1, but the device can also be prepared without using the hole injection layer 103, the hole transport layer 104 and the electron transport layer 106. The concept of the present invention is to add an electron injection layer containing alkali metal nitride between a cathode and an organic layer. Although the present invention has been described in conjunction with the preferred embodiment, the invention is not limited to the above embodiment and drawings. It should be understood that various modifications and improvements can be made by those skilled in the art under the instruction of the concept of the invention. The scope of the invention is defined by the appended claims.

Unless otherwise described, a glass substrate comprised of an ITO (Indium Tin Oxide) film and a substrate in the embodiments of the present invention can be preprocessed by the following conventional methods:

The glass substrate is cleaned by thermal detergent ultrasonic and deionized water ultrasonic methods, and then dried under an infrared lamp. Then, the dried glass substrate is preprocessed by ultraviolet ozone cleaning and low energy oxygen ion beam bombardment, wherein the ITO film on the substrate is used as an anode layer.

The material of the electron transport layer 106 and the light-emitting layer 105 used in the present invention is $Alq_3$, and C545T and DMQA are used as green light dyes in the light-emitting layer. The material of the hole injection layer is DNTPD or MTDATA. The material of the hole transport layer is NPB.

The table of materials and molecular formula thereof related in embodiments:

Alq₃

C545T

DNTPD

NPB

-continued

MTDATA m-MTDATA

DMQA

Embodiment 1

(1) Device structure:
ITO/MTDATA(30 nm)/NPB(30 nm)/Alq$_3$(55 nm)/Li$_3$N (0.8 nm)/Al(150 nm)

(2) Preparation of an organic layer:
The preprocessed glass substrate is placed in a vacuum chamber which is pumped to $1 \times 10^{-3}$ Pa. A MTDATA film of 30 nm is evaporated at an evaporation rate of 0.1 nm/s. Then, a layer of hole transport material NPB of 30 nm is evaporated on above film at an evaporation rate of 0.1 nm/s. On the hole transport layer, Alq$_3$ of 55 nm is evaporated for a light-emitting layer and an electron transport layer of the device.

Wherein the glass substrate is comprised of an ITO (Indium Tin Oxide) film and a substrate. The Sheet Resistance of the ITO film is 50Ω, and its thickness is 150 nm.

(3) Preparation of an electron injection layer:
After evaporating the electron transport layer, Li$_3$N of 0.8 nm is evaporated at an evaporation rate of 0.008 nm/s under temperature of 350° C. for an electron injection layer of the device.

(4) Preparation of an cathode:
In the light-emitting device, the cathode is formed of Al film of 150 nm. The evaporation rate of Al layer is 1.0 nm/s.

(5) Packaging with glass package sheets.

Embodiment 2

(1) Device structure:
ITO/MTDATA(30 nm)/NPB(30 nm)/Alq$_3$(55 nm)/K$_3$N (1.5 nm)/Al(150 nm)

(2) Preparation steps are the same with Embodiment 1 except after evaporating the electron transport layer, K$_3$N of 1.5 nm is evaporated.

Embodiment 3

(1) Device structure:
ITO/MTDATA(30 nm)/NPB(30 nm)/Alq$_3$(55 nm)/Cs$_3$N (2.0 nm)/Al(150 nm)

(2) Preparation steps are the same with Embodiment 1 except after evaporating the electron transport layer, Cs$_3$N of 2.0 nm is evaporated.

Comparative Embodiment 1

(1) Device structure:
ITO/MTDATA(30 nm)/NPB(30 nm)/Alq$_3$(55 nm)/LiAlO$_2$ (6.0 nm)/Al(150 nm)

(2) Preparation steps are the same with Embodiment 1 except after evaporating the electron transport layer, LiAlO$_2$ of 6.0 nm is evaporated.

Comparative Embodiment 2

(1) Device structure:
ITO/MTDATA(30 nm)/NPB(30 nm)/Alq$_3$(55 nm)/Li$_2$O (0.8 nm)/Al(150 nm)

(2) Preparation steps are the same with Embodiment 1 except after evaporating the electron transport layer, Li$_2$O of 0.8 nm is evaporated.

Comparative Embodiment 3

(1) Device structure:
ITO/MTDATA(30 nm)/NPB(30 nm)/Alq$_3$(55 nm)/Li$_2$CO$_3$ (1.0 nm)/Al(150 nm)

(2) Preparation steps are the same with Embodiment 1 except after evaporating the electron transport layer, $Li_2CO_3$ of 1.0 nm is evaporated.

TABLE 2

Performance comparison between devices with different electron injection layer structures

| Number | Material | Thickness [nm] | Lumen efficiency [lm/w] |
|---|---|---|---|
| Comparative Embodiment 1 | $Li_2O$ | 5.0 | 3.10 |
| Comparative Embodiment 2 | $LiAlO_2$ | 6.00 | 2.58 |
| Comparative Embodiment 3 | $Li_2CO_3$ | 1.00 | 2.97 |
| Embodiment 1 | $Li_3N$ | 0.80 | 3.62 |
| Embodiment 2 | $K_3N$ | 1.50 | 3.35 |
| Embodiment 3 | $Cs_3N$ | 2.00 | 3.28 |

It can be seen from the device performance comparison in Table 2 that the lumen efficiency of a device in which nitride is used is significantly higher than that of a device in which other lithium compounds such as lithium oxide, lithium metaalumiate, lithium carbonate and the like are used.

Embodiment 4

(1) Device structure:
ITO/DNTPD(100 nm)/NPB(20 nm)/$Alq_3$(30 nm):C545T [0.7%]/$Alq_3$(20 nm)/$Li_3N$(0.1 nm)/Al(150 nm)

$Alq_3$(30 nm):C545T[0.7%] is defined as: the thickness of a light-emitting layer is 30 nm, and a green light dye C545T of 0.7% by weight is contained in the light-emitting layer. They are the same below.

(2) Preparation of an organic layer:
The preprocessed glass substrate is placed in a vacuum chamber which is pumped to $1\times10^{-3}$ Pa. A DNTPD film of 100 nm is evaporated at an evaporation rate of 0.09 nm/s. Then, a layer of hole transport material NPB of 20 nm is evaporated on above film at an evaporation rate of 0.1 nm/s. On the hole transport layer, $Alq_3$ of 30 nm is evaporated for a light-emitting layer of the device wherein a green light dye C545T of 0.7% by weight is doped, and then $Alq_3$ of 20 nm is evaporated for an electron transport layer.

Wherein the glass substrate is comprised of an ITO (Indium Tin Oxide) film and a substrate. The Sheet Resistance of the ITO film is 50Ω, and its thickness is 150 nm.

(3) Preparation of an electron injection layer:
After evaporating the electron transport layer, $Li_3N$ of 0.1 nm is evaporated at an evaporation rate of 0.0013 nm/s under temperature of 400° C. for an electron injection layer of the device.

(4) Preparation of an cathode:
In the light-emitting device, the cathode is formed of Al film of 150 nm. The evaporation rate of Al layer is 1.0 nm/s.

(5) Packaging with glass package sheets.

Comparative Embodiment 4

(1) Device structure:
ITO/DNTPD(100 nm)/NPB(20 nm)/$Alq_3$(30 nm):C545T [0.7%]/$Alq_3$(20 nm)/LiF(0.7 nm)/Al(150 nm)

(2) Preparation steps are the same with Embodiment 4 except after evaporating the electron transport layer, LiF of 0.7 nm is evaporated.

Embodiment 5

(1) Device structure:
ITO/DNTPD(100 nm)/NPB(20 nm)/$Alq_3$(30 nm):C545T [0.7%]/$Alq_3$(20 nm)/$Li_3N$(0.2 nm)/Al(150 nm)

(2) Preparation steps are the same with Embodiment 4 except after evaporating the electron transport layer, $Li_3N$ of 0.2 nm is evaporated.

Embodiment 6

(1) Device structure:
ITO/DNTPD(100 nm)/NPB(20 nm)/$Alq_3$(30 nm):C545T [0.7%]/$Alq_3$(20 nm)/$Li_3N$(0.5 nm)/Al(150 nm)

(2) Preparation steps are the same with Embodiment 4 except after evaporating the electron transport layer, $Li_3N$ of 0.5 nm is evaporated.

It can be seen from the current efficiency v. current density graph of devices shown in FIG. 2: the current efficiency of a device in which a $Li_3N$ material is used as an electron injection layer is significantly higher than that of a device in which LiF is used as an electron injection layer.

Embodiment 7

(1) Device structure:
ITO/DNTPD(100 nm)/NPB(20 nm)/$Alq_3$(30 nm):C545T [0.7%]/$Alq_3$(20 nm)/$Li_3N$(0.9 nm)/Al(150 nm)

(2) Preparation steps are the same with Embodiment 4 except after evaporating the electron transport layer, $Li_3N$ of 0.9 nm is evaporated.

Embodiment 8

(1) Device structure:
ITO/DNTPD(100 nm)/NPB(20 nm)/$Alq_3$(30 nm):C545T [0.7%]/$Alq_3$(20 nm)/$Li_3N$(2.0 nm)/Al(150 nm)

(2) Preparation steps are the same with Embodiment 4 except after evaporating the electron transport layer, $Li_3N$ of 2.0 nm is evaporated.

Embodiment 9

(1) Device structure:
ITO/DNTPD(100 nm)/NPB(20 nm)/$Alq_3$(30 nm):C545T [0.7%]/$Alq_3$(20 nm)/$Li_3N$(5.0 nm)/Al(150 nm)

(2) Preparation steps are the same with Embodiment 4 except after evaporating the electron transport layer, $Li_3N$ of 5.0 nm is evaporated.

Embodiment 10

(1) Device structure:
ITO/DNTPD(100 nm)/NPB(20 nm)/$Alq_3$(30 nm):C545T [0.7%]/$Alq_3$(20 nm)/$Li_3N$(10.0 nm)/Al(150 nm)

(2) Preparation steps are the same with Embodiment 4 except after evaporating the electron transport layer, $Li_3N$ of 10.0 nm is evaporated.

TABLE 3

Performance comparison between devices with $Li_3N$ of different thicknesses and a device with LiF

| Number | Material | Thickness [nm] | Temperature [° C.] | Efficiency [cd/A] | Lifetime [Hr] |
|---|---|---|---|---|---|
| Embodiment 4 | $Li_3N$ | 0.10 | 400 | 9.8 | 10000 |
| Embodiment 5 | $Li_3N$ | 0.20 | 400 | 10.6 | 18000 |
| Embodiment 6 | $Li_3N$ | 0.50 | 400 | 12.3 | 25000 |
| Embodiment 7 | $Li_3N$ | 0.90 | 400 | 11.7 | 25000 |
| Embodiment 8 | $Li_3N$ | 2.00 | 400 | 10.7 | 20000 |
| Embodiment 9 | $Li_3N$ | 5.00 | 400 | 10.1 | 17000 |
| Embodiment 10 | $Li_3N$ | 10.00 | 400 | 8.6 | 8000 |
| Comparative Embodiment 4 | LiF | 0.70 | 640 | 8.2 | 12000 |

It can be seen from Table 3 that when the thickness of $Li_3N$ is within a range of 0.2-5.0 nm, the lifetimes of devices are all higher than 12,000 hours which is the lifetime of a device in which LiF having the most preferable thickness of 0.70 nm is used as an electron injection layer, and the light-emitting efficiency is higher than that of a device in which LiF is used as an electron injection layer.

Embodiment 11

(1) Device structure:
ITO/NPB(40 nm)/$Alq_3$(60 nm)/$Li_3N$(0.8 nm)/Al(150 nm)
(2) Preparation of an organic layer:
The preprocessed glass substrate is placed in a vacuum chamber which is pumped to $1\times10^{-3}$ Pa. A film of hole transport material NPB of 40 nm is evaporated on above film at an evaporation rate of 0.1 nm/s. On the hole transport layer, $Alq_3$ of 60 nm is evaporated for a light-emitting layer and an electron transport layer of the device.
Wherein the glass substrate is comprised of an ITO (Indium Tin Oxide) film and a substrate. The Sheet Resistance of the ITO film is 50Ω, and its thickness is 150 nm.
(3) Preparation of an electron injection layer:
After evaporating the electron transport layer, $Li_3N$ of 0.8 nm is evaporated at an evaporation rate of 0.0006 nm/s under temperature of 250° C. for an electron injection layer of the device.
(4) Preparation of an cathode:
In the light-emitting device, the cathode is formed of Al film of 150 nm. The evaporation rate of Al layer is 1.0 nm/s.
(5) Packaging with glass package sheets.

Embodiment 12

(1) Device structure:
ITO/NPB(40 nm)/$Alq_3$(60 nm)/$Li_3N$(0.8 nm)/Al(150 nm)
(2) Preparation steps are the same with Embodiment 11 except after evaporating the electron transport layer, $Li_3N$ of 0.8 nm is evaporated at an evaporation rate of 0.002 nm/s under temperature of 300° C. for an electron injection layer of the device.

Embodiment 13

(1) Device structure:
ITO/NPB(40 nm)/$Alq_3$(60 nm)/$Li_3N$(0.8 nm)/Al(150 nm)
(2) Preparation steps are the same with Embodiment 11 except after evaporating the electron transport layer, $Li_3N$ of 0.8 nm is evaporated at an evaporation rate of 0.008 nm/s under temperature of 350° C. for an electron injection layer of the device.

Embodiment 14

(1) Device structure:
ITO/NPB(40 nm)/$Alq_3$(60 nm)/$Li_3N$(0.8 nm)/Al(150 nm)
(2) Preparation steps are the same with Embodiment 11 except after evaporating the electron transport layer, $Li_3N$ of 0.8 nm is evaporated at an evaporation rate of 0.020 nm/s under temperature of 400° C. for an electron injection layer of the device.

Embodiment 15

(1) Device structure:
ITO/NPB(40 nm)/$Alq_3$(60 nm)/$Li_3N$(0.8 nm)/Al(150 nm)
(2) Preparation steps are the same with Embodiment 11 except after evaporating the electron transport layer, $Li_3N$ of 0.8 nm is evaporated at an evaporation rate of 0.125 nm/s under temperature of 450° C. for an electron injection layer of the device.

Embodiment 16

(1) Device structure:
ITO/NPB(40 nm)/$Alq_3$(60 nm)/$Li_3N$(0.8 nm)/Al(150 nm)
(2) Preparation steps are the same with Embodiment 11 except after evaporating the electron transport layer, $Li_3N$ of 0.8 nm is evaporated at an evaporation rate of 0.250 nm/s under temperature of 500° C. for an electron injection layer of the device.

TABLE 4

Performance comparison between devices with different evaporation rates of $Li_3N$

| Number | Thickness (nm) | Temperature [° C.] | Evaporation rate [nm/s] | Efficiency [cd/A] | Device lifetime [Hr] |
|---|---|---|---|---|---|
| Embodiment 11 | 0.8 | 250 | 0.0006 | 2.65 | 4000 |
| Embodiment 12 | 0.8 | 300 | 0.002 | 2.80 | 4000 |
| Embodiment 13 | 0.8 | 350 | 0.008 | 3.25 | 4500 |
| Embodiment 14 | 0.8 | 400 | 0.020 | 3.50 | 5000 |
| Embodiment 15 | 0.8 | 450 | 0.125 | 3.40 | 5000 |
| Embodiment 16 | 0.8 | 500 | 0.250 | 3.00 | 4500 |

It can be seen from Table 4 that when the evaporation temperature of $Li_3N$ is within 350-500° C., and its evaporation rate is within 0.008-0.250 nm/s, the light-emitting efficiency of devices is significantly higher than that of devices in which the evaporation temperature is below 350° C. or above 500° C., and the lifetime of devices is significantly higher than that of devices with other evaporation rates.

It can be seen from comparison of Table 3 and Table 4 that the lifetime of devices with a dye contained in the light-emitting layer is significantly higher than that of devices without a dye contained in the light-emitting layer.

Embodiment 17

(1) Device structure:

ITO/NPB(40 nm)/Alq$_3$(60 nm):DMQA[0.7%]/Al(5 nm):Li$_3$N[50%]/Al(150 nm)

Alq$_3$ (60 nm):DMQA[0.7%] is defined as: the thickness of a light-emitting layer is 60 nm, and a green light dye DMQA of 0.7% by weight is contained in the light-emitting layer. They are the same below.

Al(5 nm):Li$_3$N[50%] is defined as: the thickness of an electron injection layer is 5 nm, and Al of 50% by weight is contained in the electron injection layer.

(2) Preparation of an organic layer:

The preprocessed glass substrate is placed in a vacuum chamber which is pumped to $1\times10^{-3}$ Pa. A film of hole transport material NPB of 40 nm is evaporated on above film at an evaporation rate of 0.1 nm/s. On the hole transport layer, Alq$_3$ of 60 nm is evaporated for a light-emitting layer and an electron transport layer of the device, wherein a green light dye DMQA of 0.7% is doped.

Wherein the glass substrate is comprised of an ITO (Indium Tin Oxide) film and a substrate. The Sheet Resistance of the ITO film is 50Ω, and its thickness is 150 nm.

(3) Preparation of an electron injection layer:

After evaporating the electron transport layer, Li$_3$N doped with Al of 50% of 5 nm is evaporated at an evaporation rate of 0.025 nm/s under temperature of 450° C. for an electron injection layer of the device.

(4) Preparation of an cathode:

In the light-emitting device, the cathode is formed of Al film of 150 nm. The evaporation rate of Al layer is 1.0 nm/s.

(5) Packaging with glass package sheets.

The light-emitting efficiency of the device is 7.5 cd/A, and the device lifetime is 10,000 hours.

Embodiment 18

(1) Device structure:

ITO/NPB(40 nm)/Alq$_3$(60 nm):DMQA[0.7%]μM(0.8 nm):Li$_3$N[20%]/Al(150 nm)

Al(0.8 nm):Li$_3$N[20%] is defined as: the thickness of an electron injection layer is 0.8 nm, and Al of 80% by weight is contained in the electron injection layer.

(2) Preparation steps are the same with Embodiment 17 except after evaporating the electron transport layer, Li$_3$N doped with Al of 80% of 0.8 nm is evaporated at an evaporation rate of 0.02 nm/s under temperature of 400° C. for an electron injection layer of the device.

The light-emitting efficiency of the device is 7.2 cd/A, and the device lifetime is 9,800 hours.

Embodiment 19

(1) Device structure:

ITO/NPB(40 nm)/Alq$_3$(60 nm):DMQA[0.7%]/Al(0.9 nm):Li$_3$N[80%]/Al(150 nm)

Al(0.9 nm):Li$_3$N[80%] is defined as: the thickness of an electron injection layer is 0.9 nm, and Al of 20% by weight is contained in the electron injection layer.

(2) Preparation steps are the same with Embodiment 17 except after evaporating the electron transport layer, Li$_3$N doped with Al of 20% of 0.9 nm is evaporated at an evaporation rate of 0.008 nm/s under temperature of 350° C. for an electron injection layer of the device.

The light-emitting efficiency of the device is 7.0 cd/A, and the device lifetime is 9,500 hours.

Embodiment 20

(1) Device structure:

ITO/Alq$_3$(30 nm):DMQA[0.7%]/Li$_3$N (0.9 nm)/Al(150 nm)

(2) Preparation of an organic layer:

The preprocessed glass substrate is placed in a vacuum chamber which is pumped to $1\times10^{-3}$ Pa. Alq$_3$ of 30 nm is evaporated on above film for a light-emitting layer of the device, wherein a green light dye DMQA of 0.7% is doped.

Wherein the glass substrate is comprised of an ITO (Indium Tin Oxide) film and a substrate. The Sheet Resistance of the ITO film is 50Ω, and its thickness is 150 nm.

(3) Preparation of an electron injection layer:

After evaporating the electron transport layer, Li$_3$N of 0.9 nm is evaporated at an evaporation rate of 0.025 nm/s under temperature of 450° C. for an electron injection layer of the device.

(4) Preparation of an cathode:

In the light-emitting device, the cathode is formed of Al film of 150 nm. The evaporation rate of Al layer is 1.0 nm/s.

(5) Packaging with glass package sheets.

The light-emitting efficiency of the device is 6.5 cd/A, and the device lifetime is 7,000 hours.

Embodiment 21

(1) Device structure:

ITO/DNTPD(100 nm)/NPB(20 nm)/Alq$_3$(30 nm)/Li$_3$N (0.1 nm)/Al(150 nm)

(2) Preparation of an organic layer:

The preprocessed glass substrate is placed in a vacuum chamber which is pumped to $1\times10^{-3}$ Pa. A DNTPD film of 100 nm is evaporated at an evaporation rate of 0.09 nm/s for a hole injection layer. Then, a film of hole transport material NPB of 20 nm is evaporated on above film at an evaporation rate of 0.1 nm/s. On the hole transport layer, Alq$_3$ of 30 nm is evaporated for a light-emitting layer of the device.

Wherein the glass substrate is comprised of an ITO (Indium Tin Oxide) film and a substrate. The Sheet Resistance of the ITO film is 50Ω, and its thickness is 150 nm.

(3) Preparation of an electron injection layer:

After evaporating the electron transport layer, Li$_3$N of 0.8 nm is evaporated at an evaporation rate of 0.008 nm/s under temperature of 350° C. for an electron injection layer of the device.

(4) Preparation of an cathode:

In the light-emitting device, the cathode is formed of Al film of 150 nm. The evaporation rate of Al layer is 1.0 nm/s.

(5) Packaging with glass package sheets.

The light-emitting efficiency of the device is 7.0 cd/A, and the device lifetime is 9,500 hours.

Embodiment 22

(1) Device structure:

ITO/MTDATA(30 nm)/Alq$_3$(30 nm)/Alq$_3$(20 nm)/Li$_3$N (0.8 nm)/Al(150 nm)

(2) Preparation of an organic layer:

The preprocessed glass substrate is placed in a vacuum chamber which is pumped to $1\times10^{-3}$ Pa. A MTDATA film of 30 nm is evaporated at an evaporation rate of 0.1 nm/s for a hole transport layer. On the hole transport layer, Alq$_3$ of 30 nm is evaporated for a light-emitting layer of the device, and then Alq$_3$ of 20 nm is evaporated for an electron transport layer of the device.

Wherein the glass substrate is comprised of an ITO (Indium Tin Oxide) film and a substrate. The Sheet Resistance of the ITO film is 50Ω, and its thickness is 150 nm.

(3) Preparation of an electron injection layer:

After evaporating the electron transport layer, Li$_3$N of 0.8 nm is evaporated at an evaporation rate of 0.008 nm/s under temperature of 350° C. for an electron injection layer of the device.

(4) Preparation of an cathode:

In the light-emitting device, the cathode is formed of Al film of 150 nm. The evaporation rate of Al layer is 1.0 nm/s.

(5) Packaging with glass package sheets.

The light-emitting efficiency of the device is 7.0 cd/A, and the device lifetime is 9,500 hours.

Embodiment 23

(1) Device structure:

ITO/MTDATA(30 nm)/Alq$_3$(30 nm)/Li$_3$N(0.8 nm)/Al (150 nm)

(2) Preparation of an organic layer:

The preprocessed glass substrate is placed in a vacuum chamber which is pumped to 1×10$^{-3}$ Pa. A MTDATA film of 30 nm is evaporated at an evaporation rate of 0.1 nm/s for a hole transport layer. On the hole transport layer, Alq$_3$ of 30 nm is evaporated for a light-emitting layer of the device.

Wherein the glass substrate is comprised of an ITO (Indium Tin Oxide) film and a substrate. The Sheet Resistance of the ITO film is 50Ω, and its thickness is 150 nm.

(3) Preparation of an electron injection layer:

After evaporating the electron transport layer, Li$_3$N of 0.8 nm is evaporated at an evaporation rate of 0.008 nm/s under temperature of 350° C. for an electron injection layer of the device.

(4) Preparation of an cathode:

In the light-emitting device, the cathode is formed of Al film of 150 nm. The evaporation rate of Al layer is 1.0 nm/s.

(5) Packaging with glass package sheets.

The light-emitting efficiency of the device is 7.0 cd/A, and the device lifetime is 9,500 hours.

The invention claimed is:

1. An organic electroluminescence device comprising a substrate (101), an anode (102) formed on the substrate, a light-emitting layer (105) formed on the anode, an electron injection layer (107) formed on the light-emitting layer, and a cathode (108) formed on the electron injection layer, characterized in that said electron injection layer contains (i) alkali metal nitride, which is one of Li$_3$N, Na$_3$N and K$_3$N, and (ii) a metal Al dopant of 20-80% by weight.

2. The organic electroluminescence device according to claim 1, characterized in that said alkali metal nitride has a thickness of 0.2-10 nm.

3. The organic electroluminescence device according to claim 2, characterized in that said alkali metal nitride has a thickness of 0.2-2.0 nm.

4. The organic electroluminescence device according to claim 3, characterized in that said alkali metal nitride has a thickness of 0.2-0.9 nm.

5. The organic electroluminescence device according to claim 1, further comprising a hole injection layer (103) and/or a hole transport layer (104) between said anode (102) and said light-emitting layer (105).

6. The organic electroluminescence device according to claim 1, further comprising an electron transport layer (106) between said light-emitting layer (105) and said electron injection layer (107).

7. The organic electroluminescence device according to claim 1, characterized in that said light-emitting layer (105) contains dyes.

8. The organic electroluminescence device according to claim 1, wherein an evaporation temperature of said electron injection layer is 350° C.-500° C.

* * * * *